United States Patent
Kang

(10) Patent No.: US 9,070,749 B2
(45) Date of Patent: Jun. 30, 2015

(54) SEMICONDUCTOR DEVICE INCLUDING FLUORINE-FREE TUNGSTEN BARRIER LAYER AND METHOD FOR FABRICATING THE SAME

(71) Applicant: SK hynix Inc., Gyeonggi-do (KR)

(72) Inventor: Dong-Kyun Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 200 days.

(21) Appl. No.: 13/713,647

(22) Filed: Dec. 13, 2012

(65) Prior Publication Data

US 2014/0061931 A1 Mar. 6, 2014

(30) Foreign Application Priority Data

Aug. 31, 2012 (KR) ........................ 10-2012-0096679

(51) Int. Cl.
| | | |
|---|---|---|
| H01L 21/44 | (2006.01) | |
| H01L 21/768 | (2006.01) | |
| H01L 23/532 | (2006.01) | |
| H01L 23/485 | (2006.01) | |
| H01L 27/108 | (2006.01) | |
| H01L 21/285 | (2006.01) | |
| H01L 21/28 | (2006.01) | |
| H01L 29/49 | (2006.01) | |
| C23C 16/18 | (2006.01) | |
| C23C 16/455 | (2006.01) | |
| H01L 29/423 | (2006.01) | |
| H01L 29/51 | (2006.01) | |

(52) U.S. Cl.
CPC .... *H01L 21/76841* (2013.01); *H01L 23/53204* (2013.01); *H01L 23/485* (2013.01); *H01L 23/53266* (2013.01); *H01L 27/10876* (2013.01); *H01L 27/10885* (2013.01); *H01L 21/76883* (2013.01); *H01L 21/28562* (2013.01); *H01L 21/76843* (2013.01); *H01L 21/76876* (2013.01); *H01L 21/76877* (2013.01); *H01L 21/28079* (2013.01); *H01L 29/4236* (2013.01); *H01L 29/4958* (2013.01); *H01L 29/513* (2013.01); *H01L 29/517* (2013.01); *H01L 29/518* (2013.01); *C23C 16/18* (2013.01); *C23C 16/45542* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 2003/0153181 A1* | 8/2003 | Yoon et al. | 438/685 |
| 2003/0198587 A1* | 10/2003 | Kaloyeros et al. | 423/409 |
| 2006/0264031 A1 | 11/2006 | Xi et al. | |
| 2009/0163025 A1* | 6/2009 | Humayun et al. | 438/675 |
| 2010/0078817 A1* | 4/2010 | Koerner | 257/751 |
| 2010/0240180 A1* | 9/2010 | Jeon et al. | 438/239 |
| 2011/0233778 A1* | 9/2011 | Lee et al. | 257/751 |

FOREIGN PATENT DOCUMENTS

| | | |
|---|---|---|
| KR | 1019980032402 | 7/1998 |
| KR | 1020010076401 | 8/2001 |
| KR | 100321707 | 1/2002 |

(Continued)

*Primary Examiner* — Benjamin Sandvik
*Assistant Examiner* — Shaka White
(74) *Attorney, Agent, or Firm* — IP & T Group LLP

(57) ABSTRACT

A method of forming a fluorine-free tungsten diffusion barrier layer having a reduced resistivity, and a semiconductor device, and method for forming such semiconductor device, using the fluorine-free tungsten diffusion barrier layer.

24 Claims, 14 Drawing Sheets

(56) References Cited

FOREIGN PATENT DOCUMENTS

| KR | 1020020011123 | 2/2002 |
|---|---|---|
| KR | 1020030059489 | 7/2003 |
| KR | 1020110027607 | 3/2011 |
| KR | 1020110047880 | 5/2011 |

\* cited by examiner

SEMICONDUCTOR DEVICE INCLUDING FLUORINE-FREE TUNGSTEN BARRIER LAYER AND METHOD FOR FABRICATING THE SAME

CROSS-REFERENCE TO RELATED APPLICATIONS

The present application claims priority of Korean Patent Application No. 10-2012-0096679, filed on Aug. 31, 2012, which is incorporated herein by reference in its entirety.

BACKGROUND

1. Field

Exemplary embodiments of the present invention relate to semiconductor devices, and more particularly, to a semiconductor device including a fluorine-free tungsten barrier layer and a method of fabricating the same.

2. Description of the Related Art

If titanium nitride (TiN) is used as a metal gate electrode although the line width of a semiconductor device is gradually reduced, there is a problem in that resistivity is still high. In order to precisely control the amount of current that flows through a channel formed between the source and drain of the gate electrode, an operating voltage applied to the gate electrode needs to be smoothly controlled. Furthermore, a high speed operation may be achieved through a fast current speed obtained by forming a bit line using a low-resistivity material. If the problem of high resistivity is not solved, excess heat may be generated, thus deteriorating the reliability of the semiconductor device. In order to solve this problem, the physical properties of the existing materials must be changed so that the existing materials have low resistivity and high thermal conductivity or new metal must be introduced.

SUMMARY

An embodiment of the present invention is directed to providing a method of forming a tungsten layer having low resistivity and a method of fabricating a semiconductor device using the same.

In accordance with an embodiment of the present invention, a method of forming a tungsten layer may include forming a fluorine-free tungsten layer over a substrate using a fluorine-free tungsten source (FFWS); forming a bulk tungsten layer over the fluorine-free tungsten layer; and annealing the fluorine-free tungsten layer and the bulk tungsten layer.

In accordance with another embodiment of the present invention, a method of fabricating a semiconductor device may include forming a fluorine-free tungsten layer over a substrate using a fluorine-free tungsten source (FFWS) containing carbon; forming a tungsten nucleation layer over the fluorine-free tungsten layer; forming a bulk tungsten layer over the tungsten nucleation layer; and annealing the fluorine-free tungsten layer, the tungsten nucleation layer, and the bulk tungsten layer.

In accordance with yet another embodiment of the present invention, a semiconductor device may include a substrate; a gate insulating layer formed over the substrate; a fluorine-free tungsten (FFW) layer formed over the gate insulating layer; and a bulk tungsten layer formed over the FFW tungsten layer.

In accordance with another embodiment of the present invention, a method of forming a tungsten layer may include adsorbing, on a substrate, a fluorine-free tungsten compound, comprising at least a tungsten component and a carbon component; removing any unadsorbed tungsten compound; performing a plasma treatment on a provided hydrogen-containing material, so that a thin film comprising tungsten is formed by a reaction of the hydrogen-containing material with the fluorine-free tungsten compound; and removing an unreacted hydrogen-containing material.

DETAILED DESCRIPTION

Figure 1:
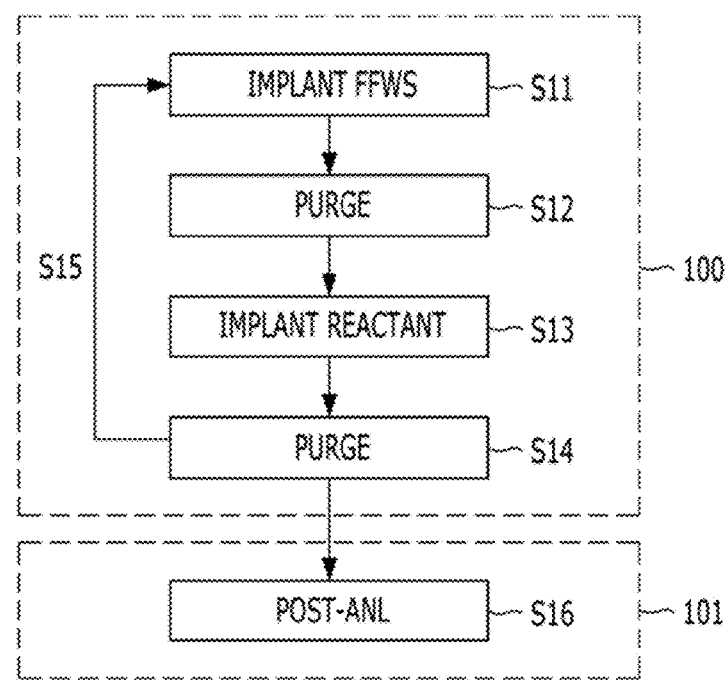
FIG. 1 is a diagram showing a method of forming a tungsten layer in accordance with an exemplary embodiment.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In an exemplary embodiment, a tungsten layer of low resistivity is applied as tungsten patterns, such as the gate electrodes, the bit lines, etc. of a memory device of 20 nm or less, and a fluorine-free tungsten (FFW) layer containing a very small amount of carbon is used as a diffusion barrier.

FIG. 1 is a diagram showing a method of forming a tungsten layer in accordance with an exemplary embodiment of the present invention. Referring to FIG. 1, the tungsten layer may be formed using an atomic layer deposition (ALD) method.

The ALD method 100 for the tungsten layer includes a fluorine-free tungsten source (FFWS) implantation step S11, a purge step S12, a reactant implantation step S13, and a purge step S14 as a unit cycle. A tungsten layer having a desired thickness may be deposited by repeating the unit cycle several times at step S15. The ALD method may be performed using power of about 250 W in a temperature of about 150° C. to about 320° C.

In the FFWS implantation step S11, a metal organic-series FFWS is adsorbed on a substrate. The substrate may be made of a specific material suitable for a semiconductor process, such as silicon (Si). Layers, such as dielectric layers and conductive layers, may be provided over the substrate. A surface of the substrate refers to a specific surface, of the substrate, on which the tungsten layer is deposited or a surface of material formed on the substrate. For example, the surface of the substrate may include materials such as, silicon, silicon oxide, a high dielectric substance, silicon nitride, doped silicon, metal, metal nitride, or other conductive materials, depending on usage. In an exemplary embodiment, the surface of the substrate may include silicon oxide ($SiO_2$). Silicon oxide ($SiO_2$) may include material used as the gate insulating layer of a transistor.

A metal organic tungsten source may be used as the FFWS. The FFWS may include a metal organic tungsten source not containing fluorine (F). The FFWS may include a compound containing tungsten (W) and carbon (C). Furthermore, the FFWS may include a compound containing tungsten (W), carbon (C), and nitrogen (N). For example, the FFWS may include dicarbonyl (η5-methyl-cyclopentadienyl)nitrosyl tungsten ($C_8H_7NO_3W$) or bis(tert-butylimino)bis (dimethylamino)tungsten ($C_{12}H_{30}N_4W$). The resistivity of the tungsten layer deposited using the FFWS is lowered by a carbon content and may function as a barrier. A flow rate of the FFWS may be controlled so that the carbon content becomes 40 at % (atom percent) or lower.

Next, in order to remove an unadsorbed FFWS, the purge step S12 is performed. The purge step may be performed by supplying an inert gas, such as argon (Ar).

In the reactant implantation step S13, the tungsten layer is deposited by a reaction with the adsorbed FFWS in an atomic layer unit. Here, the reactant may include a reducing agent or a reducing gas. The reactant may include hydrogen ($H_2$)-containing material. The reactant implantation step S13 may include a hydrogen ($H_2$) plasma treatment. In an exemplary embodiment, the reactant implantation step S13 may include a hydrogen ($H_2$) plasma treatment. If the hydrogen ($H_2$) plasma treatment is performed as described above, the tungsten layer is deposited by a reaction of the FFWS to hydrogen ($H_2$). The carbon content of the tungsten layer deposited by the hydrogen ($H_2$) plasma treatment may be controlled so that it becomes about 40 atomic percent (at %) or lower. In order to control the carbon content, conditions (for example, power of 250 W) for the hydrogen ($H_2$) plasma treatment may be controlled. An impurity, such as nitrogen or oxygen, in the tungsten layer, may be removed by the hydrogen ($H_2$) plasma treatment.

Next, the purge step S14 is performed in order to remove any unreacted reactant or reaction by-products. The purge step may be performed by supplying an inert gas, such as argon (Ar).

The tungsten layer may be deposited to a desired thickness by repeating the unit cycle, including the FFWS implantation step S11, the purge step S12, the reactant implantation step S13, and the purge step S14, several times at step S15. The tungsten layer, in accordance with an exemplary embodiment may be formed to a thickness of about 20 to about 30 Å. Step coverage is excellent because the ALD method is used. The tungsten layer, in accordance with an exemplary embodiment may include a fluorine-free tungsten (FFW) layer or a fluorine-free tungsten carbide (FFWC) layer containing a very small amount of carbon. A carbon content contained in the FFWC layer may be about 25 to about 35 at %. This carbon content is obtained by the hydrogen ($H_2$) plasma treatment.

In an exemplary embodiment, the FFW layer or the FFWC layer is formed using a metal organic tungsten source not containing fluorine (F). Since fluorine (F) is not included in the layer, a surface of the underlying substrate is not deteriorated. Furthermore, a carbon content within the layer may be controlled by the hydrogen ($H_2$) plasma treatment. Particularly, by controlling the carbon content to be about 40 at % or lower, the resistivity of the tungsten layer is lowered and the tungsten layer may function as a diffusion barrier.

After depositing the tungsten layer, annealing 101 may be performed. The annealing 101 is a post-annealing (post-ANL) step S16. The post-ANL step S16 is a process of reducing the resistivity of the tungsten layer. The post-ANL step S16 may include a rapid thermal treatment (RTP). The post-ANL step S16 may be performed for about 1 hour. The post-ANL step S16 may be performed in a nitrogen ($N_2$) atmosphere in order to prevent the tungsten layer from being oxidized. The post-ANL step S16 may be performed in a temperature of about 800° C. As a result of the post-ANL step S16, a grain size of the tungsten layer is increased, the phase of the tungsten layer is changed so that the tungsten layer has a low coordination number, and the carbon concentration of the tungsten layer is reduced. As a result of the post-ANL step S16, small grains in a $W_2C$ phase and in a β-W phase are changed into very large grains in an α-W phase.

For example, the carbon concentration of the tungsten layer may be reduced to about 20 at % or lower (for example, about 10 to about 15 at %) by the post-ANL step S16. The grain size of the tungsten layer is increased about 10 times or more. As a result, the tungsten layer on which the post-ANL step S16 has been performed has a reduced carbon concentration and large grains, with the result that the resistivity of the tungsten layer is reduced by about 80% or more, as compared with the tungsten layer after deposition.

The tungsten layer in accordance with an exemplary embodiment may be used as a diffusion barrier for preventing the diffusion of metal. Furthermore, the tungsten layer in accordance with an exemplary embodiment may be used as a nucleation layer. The nucleation layer provides a growth site for a bulk tungsten layer.

The tungsten layer, in accordance with an exemplary embodiment may be used in a tungsten pattern, including a diffusion barrier and a nucleation layer. The tungsten pattern may include gate electrodes, metal lines, bit lines, and contact plugs. Since the tungsten layer in accordance with an exemplary embodiment may play a role of a nucleation layer, a process in a tungsten pattern process may be simplified. That is, one tungsten layer may function as both a diffusion barrier and a nucleation layer.

Figure 2A:
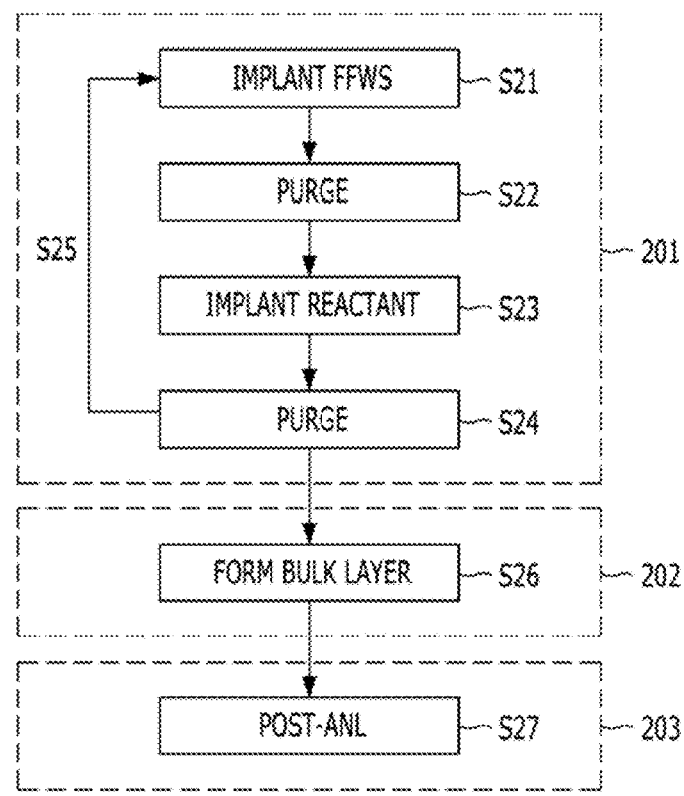
FIG. 2A is a diagram showing a method of forming a tungsten layer in accordance with an exemplary embodiment.
Figure 2B:
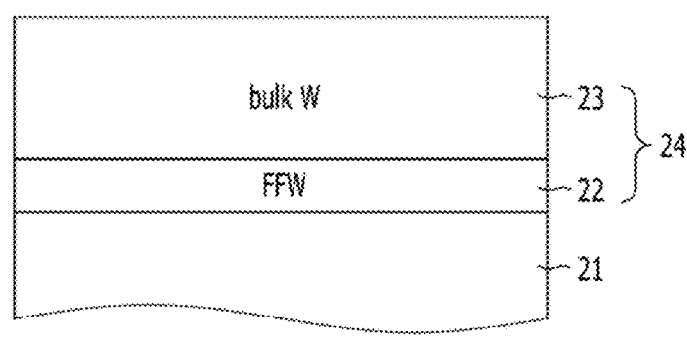
FIG. 2B is a diagram showing the structure of the tungsten layer according to FIG. 2A.

FIG. 2A is a diagram showing a method of forming a tungsten layer in accordance with an exemplary embodiment of the present invention, and FIG. 2B is a diagram showing the structure of the tungsten layer according to FIG. 2A.

Referring to FIG. 2B, a tungsten layer 24 is formed over a substrate 21. The substrate 21 may be made of specific material suitable for a semiconductor process, such as silicon (Si). Layers, such as dielectric layers or conductive layers, may be provided over the substrate. A surface of the substrate 21 refers to a specific surface of the substrate on which the tungsten layer 24 is deposited or to a surface of material formed on the substrate. For example, the surface of the substrate 21 may include materials, such as silicon, silicon oxide, a high dielectric substance, silicon nitride, doped silicon, metal, metal nitride, or other conductive materials, depending on usage. In an exemplary embodiment, the surface of the substrate 21 may include silicon oxide ($SiO_2$). Silicon oxide ($SiO_2$) may include material used as the gate insulating layer of a transistor.

The tungsten layer 24, in accordance with an exemplary embodiment, may be formed by depositing a first tungsten layer 22 and a second tungsten layer 23. The first tungsten layer 22 may be formed using an ALD method. The second tungsten layer 23 may be formed using an ALD method or a CVD method. If an ALD method is used, the first tungsten layer 22 and the second tungsten layer 23 may be deposited within the same chamber. The first tungsten layer 22 may be a diffusion barrier layer, and the second tungsten layer 23 may be a bulk layer. Accordingly, the tungsten layer 24, in accordance with an exemplary embodiment, may include a stack structure of a tungsten diffusion barrier layer and a bulk tungsten layer.

A method of forming the tungsten layer 24 is described below with reference to FIG. 2A.

Referring to FIG. 2A, the method of forming the tungsten layer 24 in accordance with an exemplary embodiment includes forming the first tungsten layer 22 at step 201, forming the second tungsten layer 23 at step 202, and performing annealing at step 203.

Step 201 Forming the First Tungsten Layer

The first tungsten layer 22 may be formed using an FFWS. For example, the first tungsten layer 22 may be formed by an ALD method. In the ALD method for forming the first tungsten layer 22, an FFWS implantation step S21, a purge step S22, a reactant implantation step S23, and a purge step S24 form a unit cycle. The first tungsten layer 22, having a desired thickness, may be formed by repeating the unit cycle several times at step S25. The ALD method may be performed using power of about 250 W in a temperature of about 150° C. to about 320° C.

In the FFWS implantation step S21, the FFWS is adsorbed on a substrate 21. A metal organic tungsten source may be used as the FFWS. The FFWS may include a metal organic tungsten source not containing fluorine (F). The FFWS may include a compound containing tungsten (W) and carbon (C). Furthermore, the FFWS may include a compound containing tungsten (W), carbon (C), and nitrogen (N). For example, the FFWS may include $C_8H_7NO_3W$ or $C_{12}H_{30}N_4W$. The resistivity of the first tungsten layer 22, deposited using the FFWS, is lowered by a carbon content and may function as a barrier. Accordingly, the flow rate of the FFWS may be controlled so that the carbon content becomes about 40 at % or lower.

Next, in order to remove any unadsorbed FFWS, the purge step S22 is performed. The purge step S22 may be performed by supplying an inert gas, such as argon (Ar).

In the reactant implantation step S23, a tungsten layer is deposited by a reaction with the adsorbed FFWS in an atomic layer unit. Here, the reactant may include a reducing agent or a reducing gas. The reactant may include hydrogen ($H_2$)-containing material. The reactant implantation step S23 may include a hydrogen ($H_2$) plasma treatment. In an exemplary embodiment, the reactant implantation step S23 may include a hydrogen ($H_2$) plasma treatment. If the hydrogen ($H_2$) plasma treatment is performed as described above, the first tungsten layer 22 is deposited by a reaction of the FFWS to the hydrogen ($H_2$). The carbon content of the first tungsten layer 22 deposited by the hydrogen ($H_2$) plasma treatment may be controlled so that it become about 40 at % or lower. In order to control the carbon content, conditions (for example, power of about 250 W) for the hydrogen ($H_2$) plasma treatment may be controlled. An impurity, such as nitrogen or oxygen, in the tungsten layer, may be removed by the hydrogen ($H_2$) plasma treatment.

Next, the purge step S24 is performed in order to remove any unreacted reactant or reaction by-products. The purge step S24 may be performed by supplying an inert gas, such as argon (Ar).

The first tungsten layer 22 may be deposited to a desired thickness by repeating the unit cycle, including the FFWS implantation step S21, the purge step S22, the reactant implantation step S23, and the purge step S24, several times at step S25. The first tungsten layer 22, in accordance with an exemplary embodiment, may be formed to a thickness of about 20 to about 30 Å. Step coverage is excellent because the ALD method is used. The first tungsten layer 22, in accordance with an exemplary embodiment may include a fluorine-free tungsten (FFW) layer or a fluorine-free tungsten carbide (FFWC) layer containing a very small amount of carbon. The carbon content included in the FFWC layer may become about 40% or lower. For example, if the thickness of the FFWC layer is about 20 Å, the carbon content may be about 25 to about 30 at %. If the thickness of the FFWC layer is about 30 Å, the carbon content may be about 30 to about 35 at %. This carbon content may be obtained by the hydrogen ($H_2$) plasma treatment.

In an exemplary embodiment, the FFW layer, or the FFWC layer, deposited as the first tungsten layer 22 is formed using a metal organic tungsten source not containing fluorine (F). Since fluorine (F) is not included in the layer, a surface of the underlying substrate 21 is not deteriorated. Furthermore, a carbon content within the layer is lowered. Accordingly, the resistivity of the first tungsten layer 22 is improved, and the first tungsten layer 22 has the function of a diffusion barrier.

Step 202—Forming the Second Tungsten Layer (Bulk W)

The second tungsten layer 23, which is a bulk layer, may be formed using tungsten hexaflouride ($WF_6$) and hydrogen ($H_2$). The second tungsten layer 23 may be formed using a CVD method or an ALD method. The second tungsten layer 23 may be formed to a thickness of about 40 Å. The second tungsten layer 23 may be deposited at a process temperature of about 400° C. or higher, so that the second tungsten layer 23 has an α-W phase having a body centered cubic (BCC) structure of low resistivity. The second tungsten layer 23 may be formed using the first tungsten layer 22 as a growth site. That is, the first tungsten layer 22 functions as a nucleation layer.

As described above, the first tungsten layer 22 includes the FFW layer not containing fluorine (F), and the second tungsten layer 23 may contain a very small amount of fluorine (F).

Although the second tungsten layer 23 contains fluorine (F), fluorine (F) may be prevented from being diffused into the substrate 21 under the first tungsten layer 22 because the first tungsten layer 22 functions as a diffusion barrier.

Meanwhile, when forming the second tungsten layer 23, an FFWS made of $C_8H_7NO_3W$ or $C_{12}H_{30}N_4W$ may be used as a tungsten source. If the second tungsten layer 23 is formed using the FFWS, however, it is disadvantageous in terms of resistivity because carbon is included in the layer. As a result, since the FFWS is used in an exemplary embodiment, resistivity may be lowered by forming the first tungsten layer 22 functioning as a diffusion barrier and a nucleation layer and forming the second tungsten layer 23 using tungsten hexaflouride ($WF_6$).

The tungsten layer 24, including the FFW layer and the bulk tungsten layer may be formed by forming the first tungsten layer 22 and the second tungsten layer 23 using a series of the processes. A tungsten stack, such as "W/FFW," may be used as the tungsten layer 24.

Annealing Step 203

After forming the tungsten layer 24, the annealing step 203 may be performed in order to reduce resistivity. The annealing 203 is a post-ANL step S27. The post-ANL step S27 is performed in order to reduce the resistivity of the tungsten layer 24. The post-ANL step S27 may include RTP. The post-ANL step S27 may be performed for about 1 hour. The post-ANL step S27 may be performed in a nitrogen ($N_2$) atmosphere in order to prevent the tungsten layer 24 from being oxidized. The post-ANL step S27 may be performed in a temperature of about 800° C.

As a result of the post-ANL step S27, the grain sizes of the first and the second tungsten layers 22 and 23 are increased, the phases of the first and the second tungsten layers 22 and 23 are changed so that the first and the second tungsten layers 22 and 23 have a low coordination number, and the carbon concentrations of the first and the second tungsten layers 22 and 23 are reduced. As a result of the post-ANL step S27, the carbon concentrations of the first and the second tungsten layers 22 and 23 are further reduced, and small grains in a $W_2C$ phase and in a β-W phase are changed into very large grains in an α-W phase.

For example, the carbon concentrations of the first and the second tungsten layers 22 and 23 are reduced to about 20 at % or lower (for example, about 10 to about 15 at %) by the post-ANL step S27. The grain sizes of the first and the second tungsten layers 22 and 23 are increased about 10 times or more. As a result, the tungsten layer 24, on which the post-ANL step S27 has been performed, has a reduced carbon concentration and large grains. As a result, the resistivity of the tungsten layer 24 is reduced by about 80% or more as compared with the tungsten layer after deposition.

Furthermore, fluorine (F) within the layer may be removed by the post-ANL step S27.

The first tungsten layer 22, in accordance with an exemplary embodiment, may be used as a diffusion barrier for preventing the diffusion of metal. Furthermore, the first tungsten layer 22, in accordance with an exemplary embodiment, may be used as a nucleation layer. The nucleation layer provides a growth site for the second tungsten layer 23, which is a bulk tungsten layer.

The tungsten layer 24, in accordance with an exemplary embodiment may be used in a tungsten pattern, including a diffusion barrier and a nucleation layer. The tungsten pattern may include gate electrodes, metal lines, bit lines, and contact plugs. Since the first tungsten layer 22, in accordance with an exemplary embodiment, may function as a nucleation layer, a process in a tungsten pattern process may be simplified. That is, the first tungsten layer 22 may function as both a diffusion barrier and a nucleation layer.

Figure 3A:
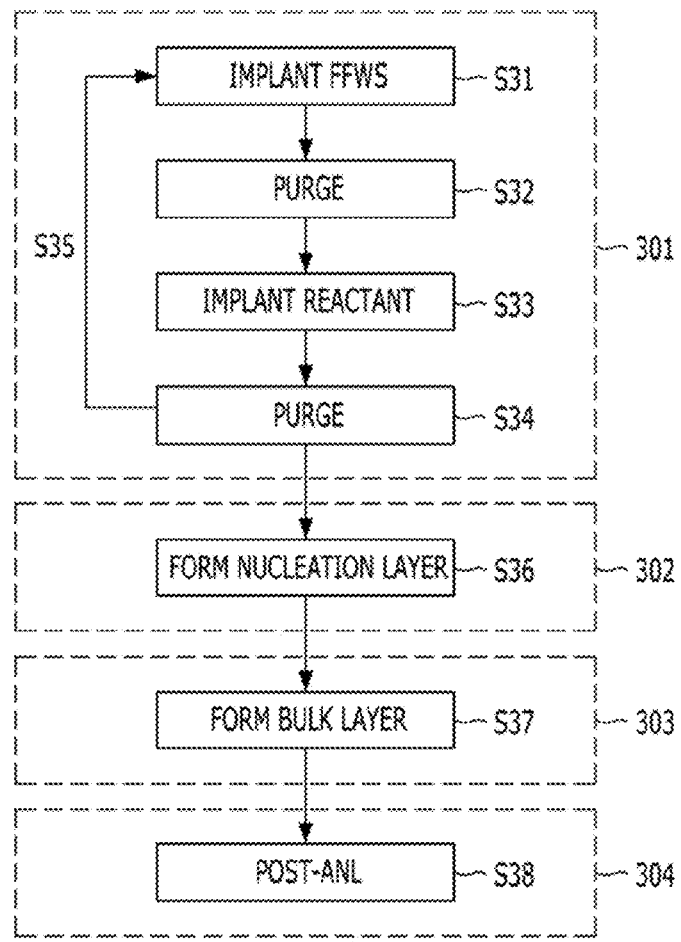
FIG. 3A is a diagram showing a method of forming a tungsten layer in accordance with an exemplary embodiment.
Figure 3B:
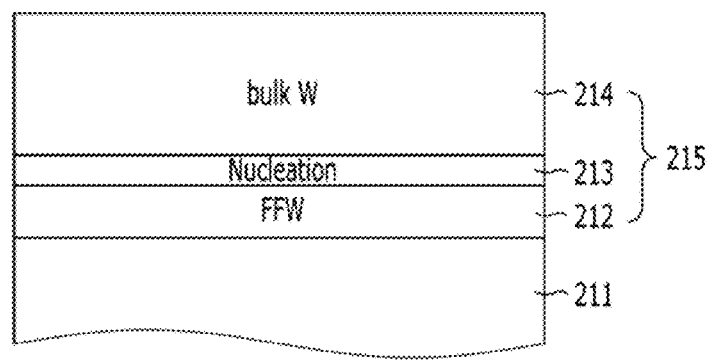
FIG. 3B is a diagram showing the structure of a tungsten layer according to FIG. 3A.

FIG. 3A is a diagram showing a method of forming a tungsten layer, in accordance with an exemplary embodiment of the present invention, and FIG. 3B is a diagram showing the structure of a tungsten layer according to FIG. 3A.

Referring to FIG. 3B, a tungsten layer 215 is formed over a substrate 211. The substrate 211 may be made of specific material suitable for a semiconductor process, such as silicon (Si). Layers, such as dielectric layers or conductive layers, may be provided over the substrate. A surface of the substrate 211 refers to a specific surface, of the substrate, on which the tungsten layer 215 is deposited or a surface of material formed on the substrate. For example, the surface of the substrate 211 may include materials, such as silicon, silicon oxide, a high dielectric substance, silicon nitride, doped silicon, metal, metal nitride, or other conductive materials, depending on usage. In an exemplary embodiment, the surface of the substrate 211 may include silicon oxide ($SiO_2$). Silicon oxide ($SiO_2$) may include material used as the gate insulating layer of a transistor.

The tungsten layer 215 may be formed by stacking a first tungsten layer 212, a second tungsten layer 213, and a third tungsten layer 214. The first tungsten layer 212 may be formed using an ALD method. The second tungsten layer 213 and the third tungsten layer 214 may be formed using an ALD method or a CVD method. If an ALD method is used, the first tungsten layer 212, the second tungsten layer 213, and the third tungsten layer 214 may be deposited within the same chamber. The first tungsten layer 212 may function as a barrier layer, the second tungsten layer 213 may function as a nucleation layer, and the third tungsten layer 214 may function as a bulk layer. Accordingly, the tungsten layer 215, in accordance with an exemplary embodiment may include a stack structure of a tungsten barrier layer, a nucleation layer, and a bulk tungsten layer.

A method of forming the tungsten layer 215 is described below with reference to FIG. 3A.

Referring to FIG. 3A, the method of forming the tungsten layer 215, in accordance with an exemplary embodiment, includes forming the first tungsten layer 212 at step 301, forming the second tungsten layer 213 at step 302, forming the third tungsten layer 214 at step 303, and performing annealing at step 304.

Step 301—Forming the First Tungsten Layer

The first tungsten layer 212 may be formed using an FFWS. For example, the first tungsten layer 212 may be formed by an ALD method using an FFWS. In the ALD method for forming the first tungsten layer 212, an FFWS implantation step S31, a purge step S32, a reactant implantation step S33, and a purge step S34 form a unit cycle, and the first tungsten layer 212 having a desired thickness may be deposited by repeating the unit cycle several times at step S35. The ALD method may be performed using power of about 250 W in a temperature of 150 to 320° C.

In the FFWS implantation step S31, the FFWS is adsorbed on the substrate 211. A metal organic tungsten source may be used as the FFWS. The FFWS may include a metal organic tungsten source not containing fluorine (F). The FFWS may include a compound containing tungsten (W) and carbon (C). Furthermore, the FFWS may include a compound containing tungsten (W), carbon (C), and nitrogen (N). For example, the FFWS may include $C_8H_7NO_3W$ or $C_{12}H_{30}N_4W$. The resistivity of the first tungsten layer 212 is lowered by a carbon content and may function as a barrier layer. A flow rate of the FFWS may be controlled so that the carbon content becomes about 40 at % (atom percent) or lower.

Next, in order to remove an unadsorbed FFWS, the purge step S32 is performed. The purge step S32 may be performed by supplying an inert gas, such as argon (Ar).

In the reactant implantation step S33, a tungsten layer of is deposited by a reaction with the adsorbed FFWS in an atomic layer unit. Here, the reactant may include a reducing agent or a reducing gas. The reactant may include hydrogen ($H_2$)-containing material. The reactant implantation step S33 may include hydrogen ($H_2$) plasma treatment. In an exemplary embodiment, the reactant implantation step S33 may include hydrogen ($H_2$) plasma treatment. If the hydrogen ($H_2$) plasma treatment is performed as described above, the first tungsten layer 212 is deposited by a reaction of the FFWS to hydrogen (Hz). A carbon content within the first tungsten layer 212 deposited by the hydrogen ($H_2$) plasma treatment may be controlled so that it becomes about 40 at % or lower. In order to control the carbon content, conditions (for example, power of about 250 W) for the hydrogen ($H_2$) plasma treatment may be controlled. An impurity, such as nitrogen or oxygen, included in the tungsten layer, may be removed by the hydrogen ($H_2$) plasma treatment.

Next, the purge step S34 is performed in order to remove any unreacted reactant or reaction by-products. The purge step S34 may be performed by supplying an inert gas, such as argon (Ar).

The first tungsten layer 212 may be deposited to a desired thickness by repeating the unit cycle, including the FFWS implantation step S31, the purge step S32, the reactant implantation step S33, and the purge step S34, several times at step S35. The first tungsten layer 212 in accordance with an exemplary embodiment may be formed to a thickness of about 20 to about 30 Å. Step coverage is excellent because the ALD method is used. The first tungsten layer 212 in accordance with an exemplary embodiment may include a fluorine-free tungsten (FFW) layer or a fluorine-free tungsten carbide (FFWC) layer containing a very small amount of carbon. A carbon content included in the FFWC layer may be about 25 to about 35 at %. The carbon content is obtained by the hydrogen ($H_2$) plasma treatment.

In an exemplary embodiment, the FFW layer or the FFWC layer deposited as the first tungsten layer 212 is formed using a metal organic tungsten source not containing fluorine (F). Since fluorine (F) is not included in the layer, a surface of the underlying substrate 211 is not deteriorated. Furthermore, since the carbon content within the layer is controlled to about 40 at % or lower by the hydrogen ($H_2$) plasma treatment, the resistivity of the first tungsten layer 212 may be improved and the first tungsten layer 212 may function as a diffusion barrier.

Step 302—Forming the Second Tungsten (Nucleation) Layer

The second tungsten layer 213 is deposited on the first tungsten layer 212. The second tungsten layer 213 functions as a nucleation layer. The second tungsten layer 213 may be formed using an ALD method or a CVD method. If an ALD method is used, the first tungsten layer 212 and the second tungsten layer 23 may be performed within the same chamber.

The second tungsten layer 213 may use tungsten hexaflouride ($WF_6$) as a tungsten source and may use diborane ($B_2H_6$) as a socking gas. The second tungsten layer 213 may be formed by implanting and purging each of tungsten hexaflouride ($WF_6$) and diborane ($B_2H_6$) about 5 to 6 times. Since diborane ($B_2H_6$) is used as the socking gas, the second tungsten layer 213 has an amorphous phase. As a result, the second tungsten layer 213 has reduced resistivity because it has a large grain size. The second tungsten layer 213 has a thin thickness of about 20 Å or less. The flow rate of diborane ($B_2H_6$) is about 300 sccm or higher, and a process temperature is about 350° C. or less. The grain size of the third tungsten layer 214 may be increased as a result of the second tungsten layer 213 having an amorphous phase. The second tungsten layer 213 may function as a nucleation layer. Moreover, the second tungsten layer 213 is a thin tungsten layer that functions as a growth site for the third tungsten layer 214, which is a bulk tungsten layer.

If the second tungsten layer 213 is formed as a nucleation layer, sheet resistance Rs may have uniformity of about 5% or lower.

Step 303—Forming the Third Tungsten (Bulk W) Layer

The third tungsten layer 214, which is a bulk layer, may be formed using tungsten hexaflouride ($WF_6$) and hydrogen ($H_2$). Here, in order to obtain a low resistivity, it is preferred that the second tungsten layer 213, which may be a nucleation layer, be formed as thin as possible, as the second tungsten layer 213 has a much higher resistivity than the third tungsten layer 214, which is a bulk layer. However, when the bulk layer is formed directly on the second tungsten layer 213, immediately after the second tungsten layer 213 is formed, the second tungsten layer 213 may be formed as thin as possible. The third tungsten layer 214 may be deposited in a process temperature of about 400° C. or higher so that it has an α-W phase having a body centered cubic (BCC) structure of low resistivity. The third tungsten layer 214 may be formed using a chemical vapor deposition (CVD) method or an ALD method.

As described above, the tungsten layer 215, in accordance with an exemplary embodiment, may have a stack structure, including the first tungsten layer 212, the second tungsten layer 213, and the third tungsten layer 214. Assuming that the first tungsten layer 212 is a barrier layer and the second tungsten layer 213 and the third tungsten layer 214 are electrodes, the tungsten layer 215 may have a stack structure of 'W/FFW'. The first tungsten layer 212 includes an FFW layer not containing fluorine (F), and the second tungsten layer 213 and the third tungsten layer 214 may not include fluorine (F) or may include a very small amount of fluorine (F). Even if a very small amount of fluorine (F) is included in the second tungsten layer 213 and the third tungsten layer 214, fluorine (F) may be prevented from diffusing into the substrate 211 under the first tungsten layer 212 because the first tungsten layer 212 functions as a diffusion barrier.

Meanwhile, when forming the third tungsten layer 214, an FFWS of $C_8H_7NO_3W$ and $C_{12}H_{30}N_4W$ may be used as a tungsten source. If the third tungsten layer 214 is formed using the FFWS, however, it is disadvantageous in terms of resistivity because carbon is included in the layer. As a result, since the FFWS is used in an exemplary embodiment, resistivity may be lowered by forming the first tungsten layer 212, which functions as a barrier, and forming the nucleation layer and the bulk layer using tungsten hexaflouride ($WF_6$).

Step 304—Annealing

After forming the tungsten layer 215, including the first tungsten layer 212, the second tungsten layer 213, and the third tungsten layer 214, the annealing step 304 is performed in order to reduce resistivity. The annealing step 304 is a post-ANL step S38. The post-ANL step S38 may include RTP. The post-ANL step S38 may be performed for about 1 hour. The post-ANL step S38 may be performed in a nitrogen ($N_2$) atmosphere in order to prevent the tungsten layer 215 from being oxidized. The post-ANL step S38 may be performed in a temperature of about 800° C.

As a result of the post-ANL step S38, the grain sizes of the first to third tungsten layers 212, 213, and 214 are increased, the phases of the first to third tungsten layers 212, 213, and 214 are changed so that first to third tungsten layers 212, 213, and 214 have a low coordination number, and the carbon concentrations of the first to third tungsten layers 212, 213, and 214 are reduced. By the post-ANL step S38, the carbon concentrations of the first to third tungsten layers 212, 213, and 214 are further reduced, and small grains in a $W_2C$ phase and in a β-W phase are changed into very large grains in an α-W phase.

For example, a carbon concentration within the tungsten layer 215 is reduced to about 20 at % or lower (for example, about 10 to about 15 at %) by the post-ANL step S38. The grain size of the tungsten layer 215 is increased about 10 times or more. As a result, the tungsten layer 215, on which the post-ANL step S38 has been performed, has a reduced carbon concentration and large grains, with the result that the resistivity of the tungsten layer 215 is reduced by about 80% or higher, as compared with the tungsten layer after deposition.

Furthermore, fluorine (F) within the layer may be removed by the post-ANL step S38.

The first tungsten layer 212, in accordance with an exemplary embodiment, may be used as a diffusion barrier for preventing the diffusion of metal.

The tungsten layer 215, in accordance with an exemplary embodiment, may be used in a tungsten pattern, including a diffusion barrier and a nucleation layer. The tungsten pattern may include gate electrodes, metal lines, bit lines, or contact plugs.

Figure 4:
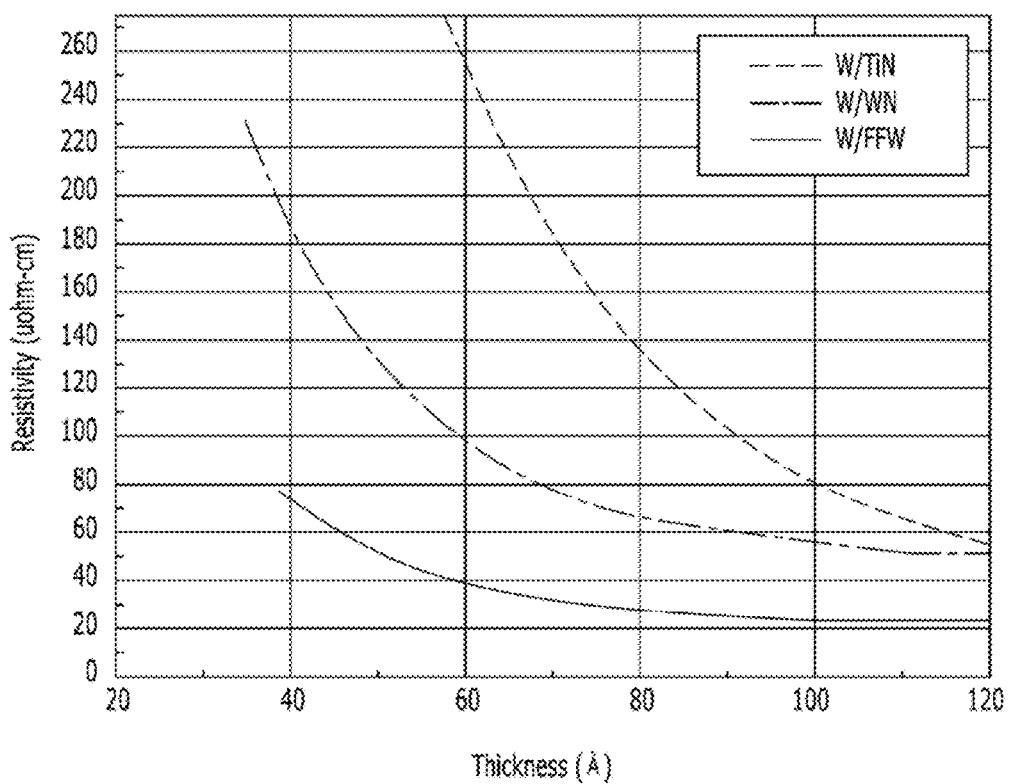
FIG. 4 is a diagram showing a comparison between the resistivities of materials used as the material of a gate electrode.

FIG. 4 is a diagram showing a comparison between the resistivities of materials used as the material of a gate electrode. FIG. 4 is a diagram showing a comparison between resistances of a first sample, W/TiN, in which a titanium nitride layer and a tungsten layer are stacked, a second sample, W/WN, in which a tungsten nitride layer and a tungsten layer are stacked, and a third sample, W/FFW, in which an FFW layer and a tungsten layer are stacked. The second sample W/WN was subjected to RTP before forming the tungsten layer, and the third sample was subjected to annealing ANL after forming the FFW layer and the tungsten layer. In the first sample to the third samples, the tungsten layer is used as a gate electrode, and the titanium nitride (TiN) layer, the tungsten nitride (WN) layer, and the FFW layer are used as the diffusion barriers of the tungsten layers in the first sample to the third samples, respectively. In the first sample and the second sample, the tungsten layer is a bulk tungsten layer that is formed using tungsten hexaflouride ($WF_6$) and hydrogen ($H_2$), as described in an exemplary embodiment. In the third sample, the tungsten layer may be the bulk tungsten layer in accordance with an exemplary embodiment, or the tungsten layer may include the nucleation layer and the bulk tungsten layer in accordance with an exemplary embodiment.

From FIG. 4, it may be seen that the third sample W/FFW using the FFW layer as a diffusion barrier has a much lower resistivity than the first sample W/TiN and the second sample W/WN.

For example, assuming that each of the second sample and the third sample has a thickness of about 60 Å, the second sample has resistivity of about 100 μohm-cm, whereas the third sample has very low resistivity of about 40 μohm-cm. The first sample has very high resistivity of about 240 μohm-cm.

As described above, a tungsten gate electrode having low resistivity may be formed using the FFW layer, in accordance with an exemplary embodiment, as a diffusion barrier.

As a result, when the FFW layer or the FFWC layer, in accordance with an exemplary embodiments is used as a diffusion barrier, resistivity may be significantly reduced as compared with a tungsten gate electrode using tungsten nitride and titanium nitride as a diffusion barrier.

Table 1 below is a table showing a comparison between resistivity after deposition and resistivity after post-ANL for the third sample. A result of Table 1 corresponds to an example in which each of the FFW layer and the tungsten layer has a thickness of 30 Å.

TABLE 1

| CONDITION | ITEMS | W/FFW (30 Å/30 Å) |
|---|---|---|
| After deposition | Resistivity | 175.9 μohm-cm |
| After post-ANL | Resistivity | 36.1 μohm-cm |

From Table 1, it can be seen that resistivity after deposition was about 175.9 μohm-cm, whereas post-ANL resistivity was reduced to 36.1 μohm-cm. Post-ANL resistivity is about 80% or less of the resistivity after deposition, but before post-ANL.

Figure 5:
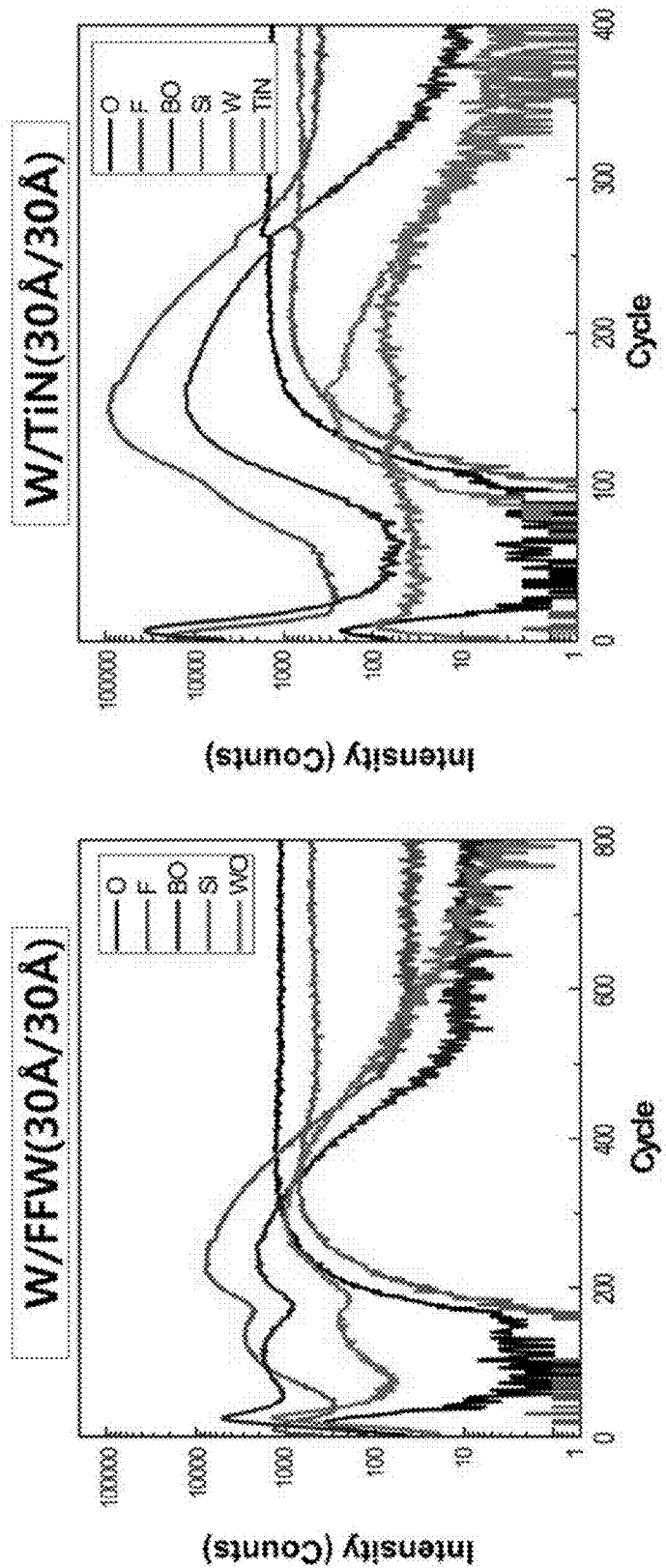
FIG. 5 is a diagram illustrating the function of the fluorine diffusion barrier of a fluorine-free tungsten (FFW) layer.

FIG. 5 is a diagram illustrating the function of the fluorine diffusion barrier of the FFW layer. FIG. 5 shows a comparison between the function of a fluorine diffusion barrier in the third sample W/FFW, which uses the FFW layer as a diffusion barrier, and the function of a fluorine diffusion barrier the first sample W/TiN using titanium nitride (TiN) as a barrier. In the third sample and the first sample, the thickness of each of the FFW layer and the titanium nitride (TiN) layers is about 30 Å, and the thickness of the tungsten layer is about 30 Å.

In FIG. 5, it can be seen that the fluorine (F) peak of the third sample is more reduced than the fluorine (F) peak of the first sample. This means that the FFW layer has a greater effect of preventing the diffusion of fluorine (F) than does the titanium nitride (TiN) layer.

Figure 6:
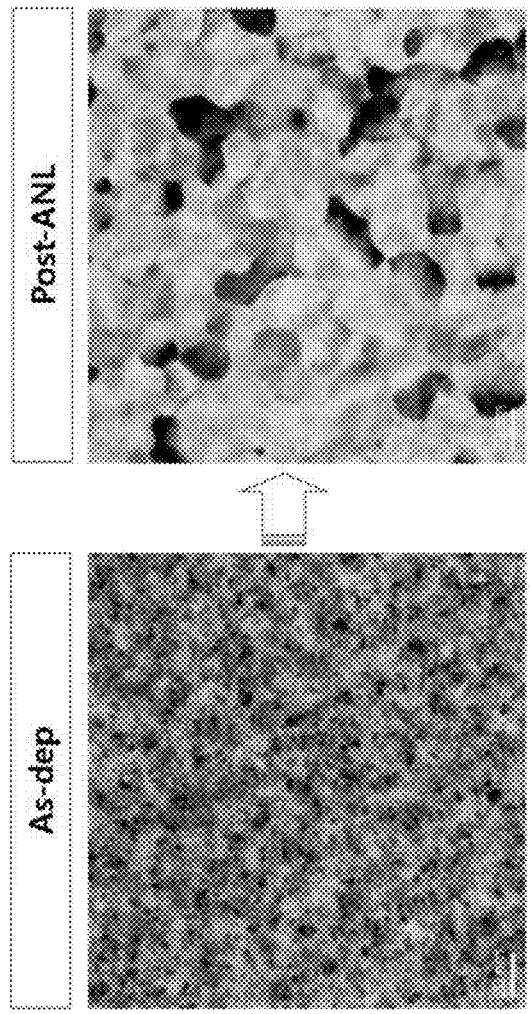
FIG. 6 is a diagram illustrating the grain size after post-ANL step.

FIG. 6 is a diagram comparing a grain size after post-ANL with a grain size before post-ANL (As-dep). From FIG. 6, it can be seen that a grain size after post-ANL is greater than a grain size after deposition As-Dep.

Figure 7:
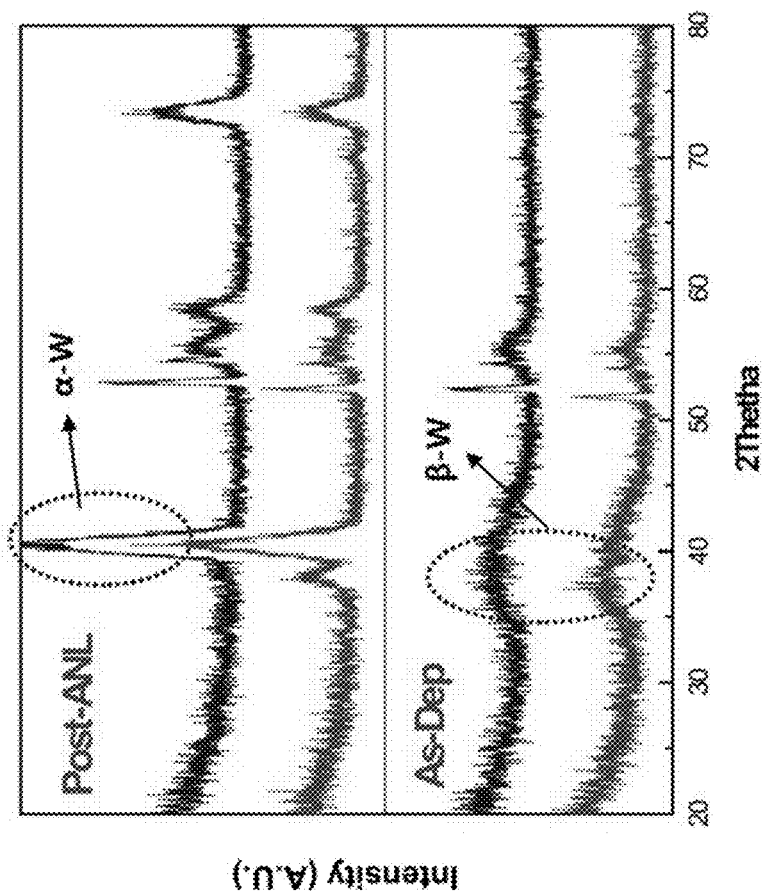
FIG. 7 is a diagram illustrating a phase transition after post-ANL step.

FIG. 7 is a diagram illustrating a phase transition after post-ANL. From FIG. 7, it can be seen that a crystal phase after deposition (As-dep) is a β-W phase, but the β-W phase is changed into an α-W phase after post-ANL.

Figure 8:
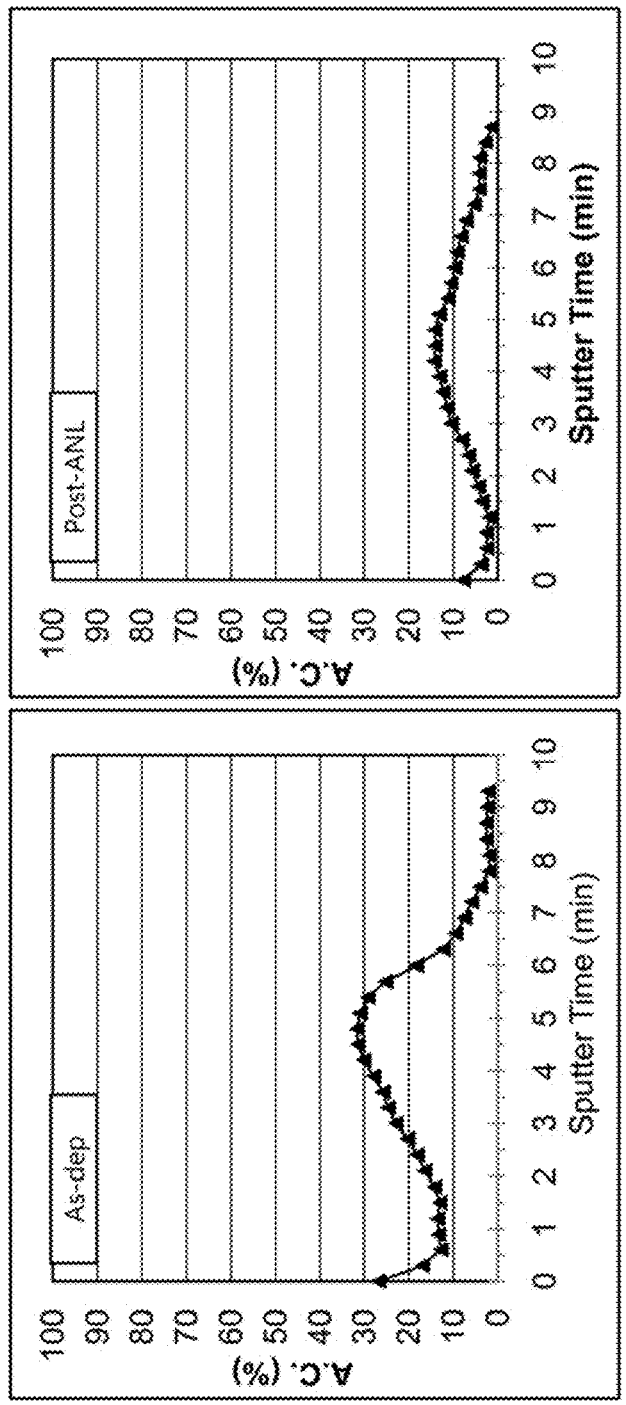
FIG. 8 is a diagram illustrating a reduction of a carbon concentration after post-ANL step.

FIG. 5 is a diagram illustrating a reduction of a carbon concentration after post-ANL, in accordance with an exemplary embodiment. FIG. 8 shows a result of measuring atom concentrations (A.C.) after deposition (As-dep) and post-ANL for the W/FFW (30 Å/30 Å). The result of FIG. 8 can be measured using an AES method.

From FIG. 8, it can be seen that after deposition, the W/FFW (30 Å/30 Å) contains a carbon concentration of about 30 at %, whereas a post-ANL carbon concentration in the W/FFW (30 Å/30 Å) is reduced to about 10 at %. Thus, it can be seen that a carbon content within the layer is significantly reduced by performing post-ANL.

The tungsten layer, including the FFW layer or the FFWC layer, in accordance with an exemplary embodiment, may be applied to gate structures, such as a planar gate, a buried gate, a recess gate, or a vertical gate. Furthermore, the tungsten layer, including the FFW layer or the FFWC layer, may also be applied to a bit line, a plug, or a metal line.

Figure 9A:
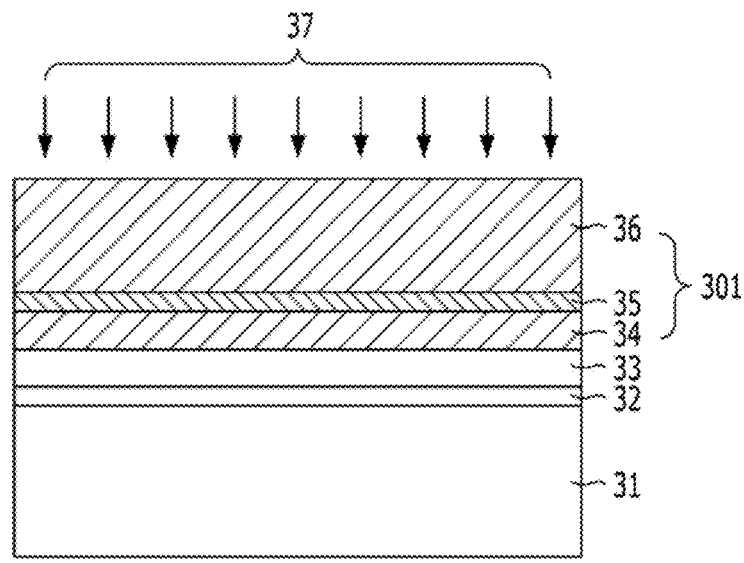
FIGS. 9A and 9B are diagrams showing a method of forming a planar gate structure using the method of forming a tungsten layer in accordance with an exemplary embodiment.
Figure 9B:
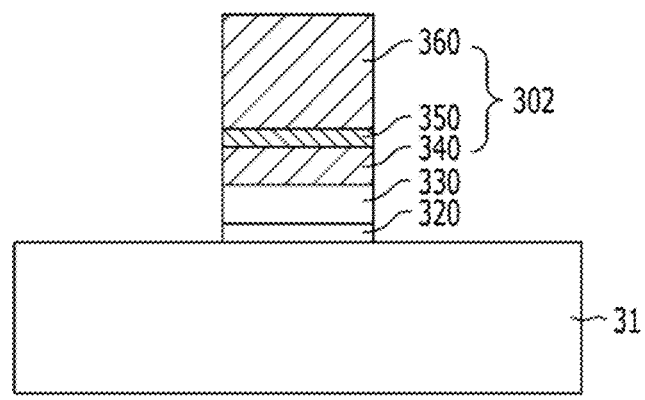

FIGS. 9A and 9B show a method of forming a planar gate structure using the method of forming a tungsten layer in accordance with an exemplary embodiment of the present invention.

As shown in FIG. 9A, a gate insulating layer 33 is formed over a semiconductor substrate 31. The gate insulating layer 33 includes at least a high dielectric constant (high-k) layer. Furthermore, an interface layer 32 may be formed between the semiconductor substrate 31 and the gate insulating layer 33. The interface layer 32 may include a silicon oxide ($SiO_2$) layer. The interface layer 32 functions to improve an electron mobility characteristic by improving an interfacial characteristic between the semiconductor substrate 31 and the gate insulating layer 33. The gate insulating layer 33 may include a high-k material layer (hereinafter referred to as a "high-k layer"). The high-k layer has a higher dielectric constant (about 3.9) than the silicon oxide ($SiO_2$) layer. Furthermore, the high-k layer is thicker than the silicon oxide layer, and the high-k layer has a lower equivalent oxide thickness (EOT) value than the silicon oxide layer. For example, the high-k layer may include metal-containing material, such as a metal oxide, a metal silicate, or a metal silicate nitride. The metal oxide may include a metal, such as hafnium (Hf), aluminum (Al), lanthanum (La), or zirconium (Zr). The metal oxide may include hafnium oxide ($HfO_2$), aluminum oxide ($Al_2O_3$), lanthanum oxide ($LaO_2$), zirconium oxide ($ZrO_2$), or a combination thereof. The metal silicate may include a metal, such as hafnium (Hf) or zirconium (Zr). The metal silicate may include hafnium silicate (HfSiO), zirconium silicate ($ZrSiO_x$), or a combination thereof. The metal silicate nitride may include hafnium silicate nitride (HfSiON) or zirconium silicate nitride (ZrSiON).

A gate stack 301 is formed over the gate insulating layer 33. The gate stack 301 may include tungsten layers. The gate stack 301 may be formed of a tungsten barrier layer 34, a nucleation tungsten layer 35, and a bulk tungsten layer 36. The gate stack 301 may be formed using the method described with reference to FIG. 3A. The tungsten barrier layer 34 may correspond to the first tungsten layer, the nucleation tungsten layer 35 may correspond to the second tungsten layer, and the bulk tungsten layer 36 may correspond to the third tungsten layer. The tungsten barrier layer 34 may be formed using an ALD method including the FFWS and the hydrogen ($H_2$) plasma treatment. The tungsten barrier layer 34 may include the FFW layer or the FFWC layer. The tungsten barrier layer 34 may function as a diffusion barrier. The nucleation tungsten layer 35 is a growth site for the bulk tungsten layer 36, and it may be formed using tungsten hexaflouride ($WF_5$) and diborane ($B_2H_6$). The bulk tungsten layer 36 may be formed using tungsten hexaflouride ($WF_6$) and hydrogen ($H_2$).

Next, post-ANL 37 may be performed as discussed above in an exemplary embodiment. The post-ANL 37 can include RTP. The post-ANL step 37 can be performed for about 1 hour. The post-ANL step 37 can be performed in a nitrogen ($N_2$) atmosphere in order to prevent the tungsten layers from being oxidized. The post-ANL 37 can be performed in a temperature of 800° C. By the post-ANL step 37, the grain sizes of the tungsten layer are increased using thermal energy as driving force, the phases of the tungsten layers are changed so that the tungsten layers have a low coordination number, and the tungsten layers have a reduced carbon concentration, with the result that the tungsten layers have reduced resistivity.

As shown in FIG. 9B, a gate structure 302 is formed by etching the gate stack 301. The gate structure 302 may include a tungsten barrier layer pattern 340, a nucleation tungsten layer pattern 350, and a bulk tungsten layer pattern 360 that are sequentially stacked. After etching the gate stack 301, the gate insulating layer 33 and the interface layer 32 may be further etched. Accordingly, a gate insulating layer pattern 330 and an interface layer pattern 320 may be further formed under the gate structure 302.

In accordance with an exemplary embodiment, the gate structure 302 becomes a metal gate structure including tungsten. The tungsten barrier layer pattern 340, which is a diffusion barrier, includes the FFW layer or the FFWC layer. Since tungsten is included in the metal gate structure, as described above, the gate structure 302 may have low resistance. Furthermore, since the tungsten barrier layer pattern 340 (diffusion barrier) does not containing fluorine (F), an attack against the gate insulating layer pattern 330 is not generated.

The gate structure 302 may be used as the gate electrode of an NMOS or a PMOS. Furthermore, the gate structure 302 may be used as the gate electrode of a CMOS circuit. Particularly, the FFW layer may reduce the threshold voltage of an NMOS.

Figure 10:
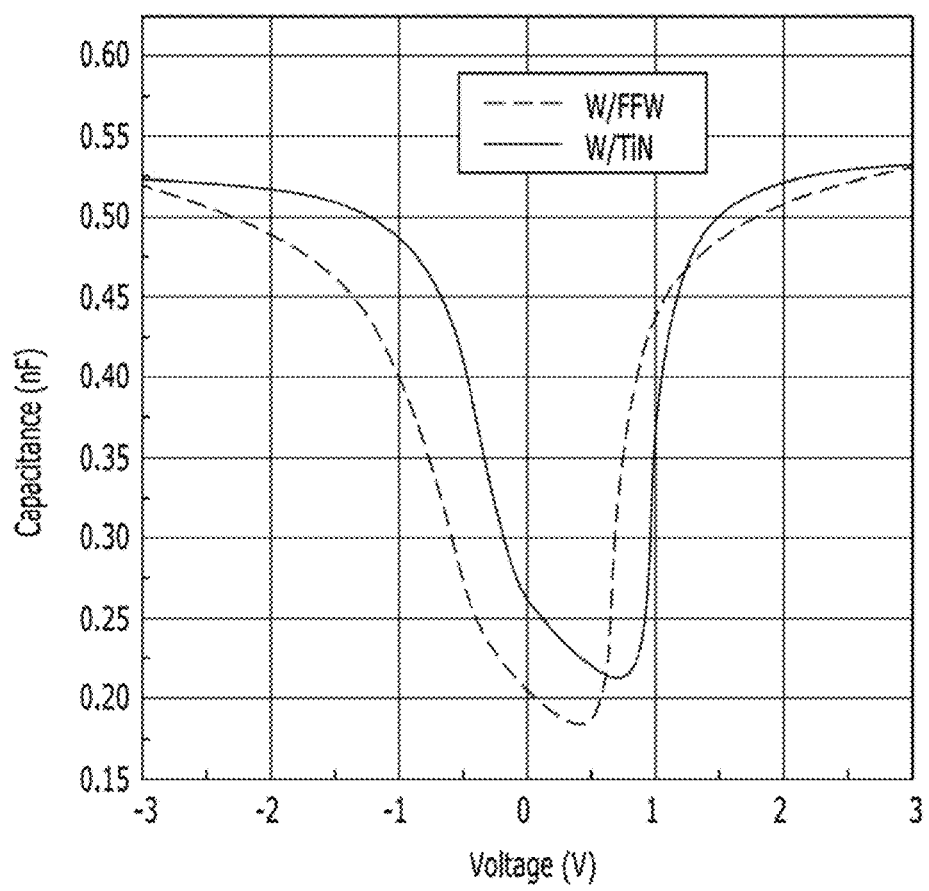
FIG. 10 is a diagram illustrating a C-V characteristic according to the use of an FFW layer as a gate electrode.

FIG. 10 shows a capacitance-voltage (C-V) characteristic according to the use of the FFW layer as the gate electrode. In FIG. 10, it can be seen that when the FFW layer is used, a threshold voltage V may be reduced when W/FFW is used, as compared to a threshold voltage when W/TiN is used.

Figure 11:
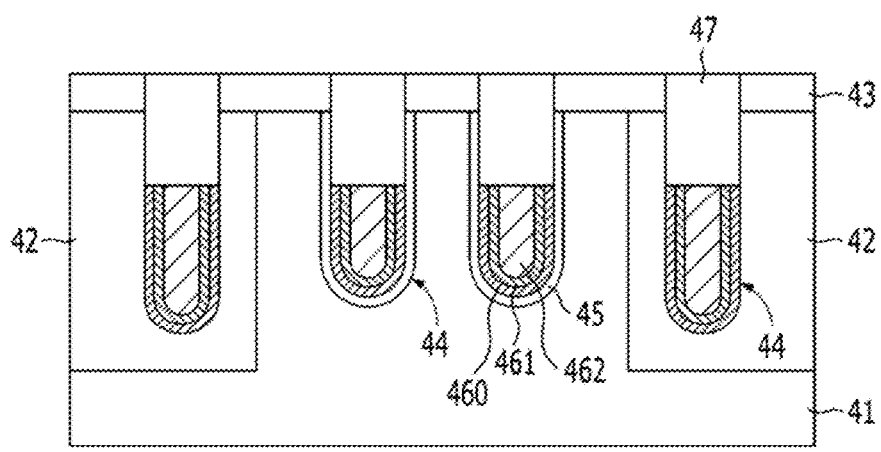
FIG. 11 is a diagram showing a buried gate structure using the method of forming a tungsten layer in accordance with an exemplary embodiment.

FIG. 11 shows a buried gate structure using the method of forming a tungsten layer, in accordance with an exemplary embodiment of the present invention.

Referring to FIG. 11, isolation layers 42 are formed in a semiconductor substrate 41. Gate trenches 44 are formed in the semiconductor substrate 41 and the isolation layers 42 by an etch process using hard mask film patterns 43. A gate insulating layer 45 is formed on a surface of each of the gate trenches 44. A buried gate electrode filling the gate trench 44 is formed on the gate insulating layer 45. The buried gate electrode includes a tungsten barrier layer 460, a nucleation tungsten layer 461, and a bulk tungsten layer 462. Capping layers 47 are formed on the respective buried gate electrode.

Figure 12:
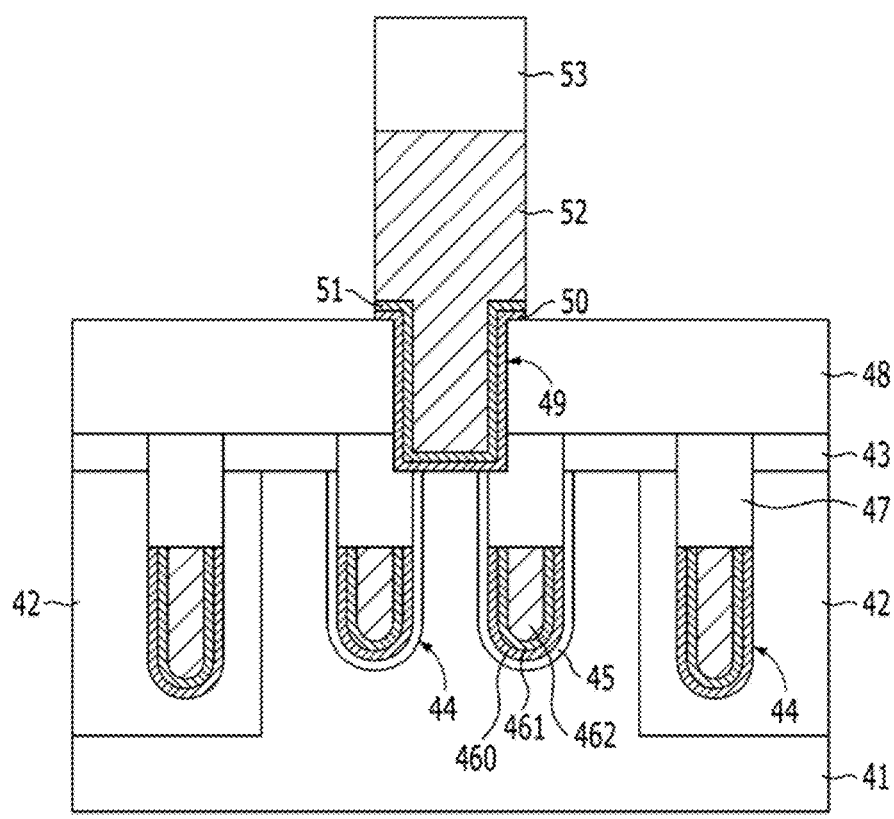
FIG. 12 is a diagram showing an example of a bit line structure using the method of forming a tungsten layer in accordance with an exemplary embodiment.

FIG. 12 shows an exemplary a bit line structure using the method of forming a tungsten layer in accordance with an exemplary embodiment of the present invention.

Referring to FIG. 12, isolation layers 42 are formed in a semiconductor substrate 41. Gate trenches 44 are formed in the semiconductor substrate 41 and the isolation layers 42 by an etch process using hard mask film patterns 43. A gate insulating layer 45 is formed on a surface of each of the gate trenches 44. Buried gate electrodes, which fill the gate trench 44, are formed on the respective gate insulating layers 45. Each of the buried gate electrodes includes a tungsten barrier layer 460, a nucleation tungsten layer 461, and a bulk tungsten layer 462. A capping layer 47 is gap-filled on the buried gate electrodes.

An interlayer insulating layer 48 is formed on the entire surface of the semiconductor substrate 41 including the capping layer 47. A bit line contact hole 49 (only one is shown as an example) is formed in the interlayer insulating layer 48. A bit line that also functions as a bit line contact plug is formed in the bit line contact hole 49. The bit line includes a tungsten barrier layer 50, a nucleation tungsten layer 51, and a bulk tungsten layer 52. A bit line hard mask layer 53 is formed on the bit line.

Figure 13:
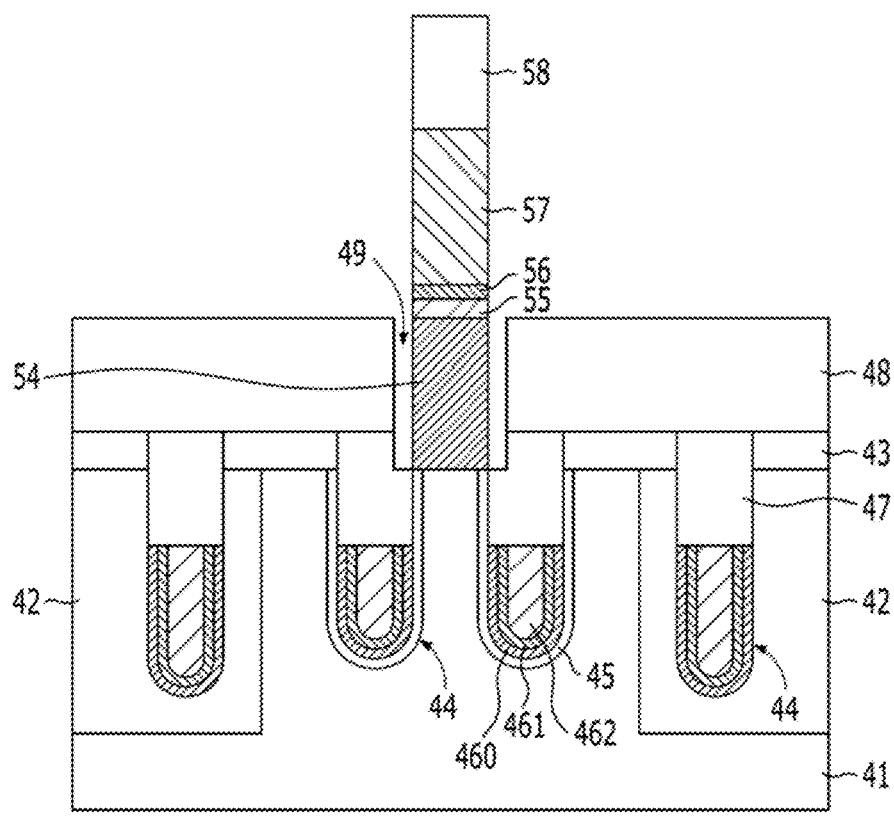
FIG. 13 is a diagram showing another example of a bit line structure using the method of forming a tungsten layer in accordance with an exemplary embodiment.

FIG. 13 shows an exemplary a bit line structure using the method of forming a tungsten layer, in accordance with an exemplary embodiment of the present invention.

In the bit line structure shown in FIG. 13, a bit line has a smaller line width than a bit line contact hole 49. A bit line contact plug 54 is formed in the bit line contact hole 49. The bit line contact plug 54 may include polysilicon. The bit line, including a tungsten barrier layer 55, a nucleation tungsten layer 56, and a bulk tungsten layer 57, is formed on the bit line contact plug 54. A bit line hard mask layer 58 is formed on the bit line.

Figure 14:
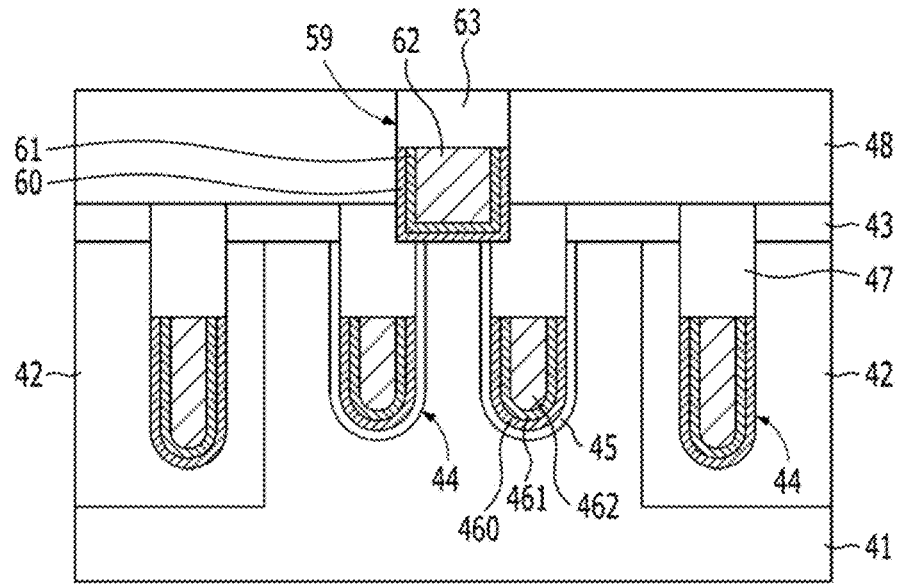
FIG. 14 is a diagram showing yet another example of a bit line structure using the method of forming a tungsten layer in accordance with an exemplary embodiment.

FIG. 14 shows an exemplary bit line structure using the method of forming a tungsten layer, in accordance with an exemplary embodiment of the present invention. The bit line structure shown in FIG. 14 is a damascene bit line structure, and a bit line is buried in a damascene pattern 59. The bit line includes a tungsten barrier layer 60, a nucleation tungsten layer 61, and a bulk tungsten layer 62. A bit line hard mask layer 63 is formed on the bit line.

Figure 15:
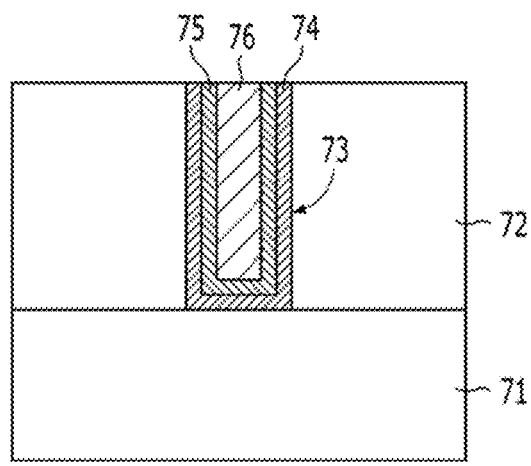
FIG. 15 is a diagram showing a contact plug using the method of forming a tungsten layer in accordance with an exemplary embodiment.

FIG. 15 shows a contact plug using the method of forming a tungsten layer, in accordance with an exemplary embodiment of the present invention.

Referring to FIG. 15, an interlayer insulating layer 72 is formed over a semiconductor substrate 71. A contact hole 73 (only one is shown as an example) is formed in the interlayer insulating layer 72. A contact plug is formed in the contact hole 73. The contact plug includes a tungsten barrier layer 74, a nucleation tungsten layer 75, and a bulk tungsten layer 76.

In accordance with this technology, a tungsten layer having the functions of a barrier layer and a nucleation layer may be formed because a fluorine-free tungsten (FFW) layer is used.

Furthermore, a tungsten layer stack having a reduced carbon concentration and low resistivity may be formed because annealing is performed after forming a thin nucleation layer and a thin bulk tungsten layer over the FFW layer. In addition, this technology may further increase an effect of preventing the diffusion of fluorine (F) because the FFW layer is used as a diffusion barrier in a tungsten pattern.

This technology is advantageous in that an improved high-speed memory operation characteristic may be secured because the tungsten stack, having low resistivity and a reduced carbon concentration, is applied to tungsten patterns, such as gate electrodes and bit lines as described above.

While the present invention has been described with respect to the specific embodiments, it will be apparent to those skilled in the art that various changes and modifications may be made without departing from the spirit and scope of the invention as defined in the following claims.

What is claimed is:

1. A method of forming a tungsten layer, the method comprising:
    forming a fluorine-free tungsten carbide (FFWC) layer over a substrate using a fluorine-free tungsten source (FFWS);
    performing $H_2$ plasma treatment to reduce the carbon content in the FFWC layer to 25-35 atom % based on the total atoms contained in the FFWC layer;
    forming a bulk tungsten layer over the FFWC layer to obtain a stack including the FFWC layer and the bulk tungsten layer; and
    annealing the stack to further reduce the carbon content in the stack to 10-15 atom % based on the total atoms contained in the stack.

2. The method of claim 1, wherein the FFWS substantially consists of tungsten and carbon.

3. The method of claim 1, wherein the FFWS substantially consists of tungsten, carbon, and nitrogen.

4. The method of claim 1, wherein the FFWS is selected from the group consisting of dicarbonyl (η5-methyl-cyclopentadienyl)nitrosyl tungsten ($C_8H_7NO_3W$), bis(tert-butylimino)bis (dimethylamino) tungsten ($C_{12}H_{30}N_4W$), and a combination thereof.

5. The method of claim 1, wherein the FFWC layer is formed using atomic layer deposition (ALD).

6. The method of claim 1, wherein forming the FFWC layer comprises:
    adsorbing the FFWS to the substrate;
    purging unadsorbed FFWS;
    performing hydrogen ($H_2$) plasma treatment against the FFWS adsorbed to the substrate to form FFWC layer; and
    purging any unreacted reactant or reaction by-products.

7. The method of claim 1, wherein the bulk tungsten layer is formed using a tungsten hexaflouride gas.

8. The method of claim 1, wherein the bulk tungsten layer is formed using ALD or chemical vapor deposition (CVD).

9. The method of claim 1, wherein the annealing is performed in a nitrogen atmosphere.

10. A method of fabricating a semiconductor device, the method comprising:
    forming a fluorine-free tungsten carbide (FFWC) layer over a substrate using a fluorine-free tungsten source (FFWS) containing carbon;
    performing $H_2$ plasma treatment to reduce the carbon content contained in the FFWC layer to 25-35 atom % based on the total atoms contained in the FFWC layer;
    forming a tungsten nucleation layer over the FFWC layer;
    forming a bulk tungsten layer over the tungsten nucleation layer to obtain a stack including the FFWC layer, the tungsten nucleation layer, and the bulk tungsten layer; and
    annealing the stack to further reduce the total carbon content contained in the stack to 10-15 atom % based on the total atoms contained in the stack.

11. The method of claim 10, further comprising:
    patterning the annealed stack to form a stack pattern.

12. The method of claim 11,
    wherein the stack pattern is a gate, a contact plug, a metal line, or a bit line.

13. The method of claim 10, wherein the FFWS is a compound substantially consisted of tungsten and carbon or a compound substantially consisted of tungsten, carbon, and nitrogen.

14. The method of claim 10, wherein the FFWS is selected from the group consisting of dicarbonyl (η5-methyl-cyclopentadienyl)nitrosyl tungsten $C_8H_7NO_3W$, bis(tert-butylimino)bis (dimethylamino) tungsten $C_{12}H_{30}N_4W$, and a combination thereof.

15. The method of claim 10, wherein the FFWC layer is formed using atomic layer deposition (ALD).

16. The method of claim 10, wherein the forming of the FFWC layer comprises:
    adsorbing the FFWS to the substrate;
    purging unadsorbed FFWS;
    performing hydrogen ($H_2$) plasma treatment against the FFWS adsorbed to the substrate to form the FFWC layer; and
    purging any unreacted reactant or reaction by-products.

17. The method of claim 10, wherein the tungsten nucleation layer and the bulk tungsten layer are formed using tungsten hexaflouride as a tungsten source.

18. The method of claim 10, wherein the tungsten nucleation layer and the bulk tungsten bulk layer are formed using ALD or chemical vapor deposition (CVD).

19. The method of claim 10, wherein the annealing is performed in a nitrogen atmosphere.

20. A semiconductor device, comprising:
    a substrate;
    a gate insulating layer formed over the substrate;
    a fluorine-free tungsten carbide (FFWC) layer formed over the gate insulating layer; and a bulk tungsten layer formed over the FFWC layer to form a stack including the FFWC layer and the bulk tungsten layer, wherein the carbon content contained in the FFWC layer is 25-35 atom % based on the total atoms contained in the FFWC layer, and wherein the carbon content contained in the stack is 10-15 atom % based on the total atoms contained in the stack.

21. The semiconductor device of claim 20, further comprising a tungsten nucleation layer formed between the bulk tungsten layer and the FFWC layer.

22. The semiconductor device of claim 20, wherein the FFWC layer is a layer substantially consisted of tungsten and carbon or a layer substantially consisted of tungsten, carbon, and nitrogen.

23. A method of forming a tungsten layer, comprising:

adsorbing a fluorine-free tungsten source (FFWS) to a substrate, wherein the FFWS includes tungsten and carbon;

removing unadsorbed FFWS;

performing hydrogen ($H_2$) plasma treatment against the FFWS adsorbed to the substrate using a $H_2$ plasma source to form a fluorine-free tungsten carbide (FFWC) layer on the substrate, wherein the carbon content contained in the FFWC layer is 25-35 atom % based on the total atoms contained in the FFWC layer;

removing an unreacted $H_2$ plasma source, forming a bulk tungsten layer over the FFWC layer to obtain a stack including the FFWC layer and the bulk tungsten layer; and annealing the stack to further reduce the total carbon content contained in the stack to 10-15 atom % based on total atoms contained in the stack.

24. The method of claim 23, wherein the FFWC is selected from the group consisting of dicarbonyl (η5-methyl-cyclopentadienyl)nitrosyl tungsten $C_8H_7NO_3W$, bis(tert-butylimino)bis (dimethylamino) tungsten $C_{12}H_{30}N_4W$, and a combination thereof.

* * * * *